(12) United States Patent
Jones

(10) Patent No.: US 6,341,490 B1
(45) Date of Patent: Jan. 29, 2002

(54) HEAT TRANSFER APPARATUS FOR SAMPLE CONTAINING WELL PLATES

(75) Inventor: Christopher L. Jones, Fitchburg, WI (US)

(73) Assignee: Gilson, Inc., Middleton, WI (US)

( * ) Notice: Subject to any disclaimer, the term of this patent is extended or adjusted under 35 U.S.C. 154(b) by 0 days.

(21) Appl. No.: 09/798,886

(22) Filed: Mar. 3, 2001

(51) Int. Cl.⁷ .................................................. F25B 21/00

(52) U.S. Cl. .............................. 62/3.7; 62/3.2; 165/80.3

(58) Field of Search ............................. 62/3.2, 3.3, 3.6, 62/3.7; 165/80.3

(56) References Cited

U.S. PATENT DOCUMENTS

| | | | | |
|---|---|---|---|---|
| 5,317,883 A | * | 6/1994 | Newman | 62/419 |
| 5,386,338 A | * | 1/1995 | Jordan et al. | 361/704 |
| 5,988,266 A | * | 11/1999 | Smith et al. | 165/78 |
| 6,223,815 B1 | * | 5/2001 | Shibasaki | 165/185 |

* cited by examiner

*Primary Examiner*—Henry Bennett
*Assistant Examiner*—Melvin Jones
(74) *Attorney, Agent, or Firm*—Philip M. Kolehmainen

(57) ABSTRACT

A thermal transfer comb includes numerous upwardly extending pins received in spaces around and between the sample containing wells of a well plate. Peltier effect modules are in contact with a base panel of the thermal transfer comb to apply heat to or remove heat from the comb. A heat sink and fan transfer heat from or to the modules.

12 Claims, 3 Drawing Sheets

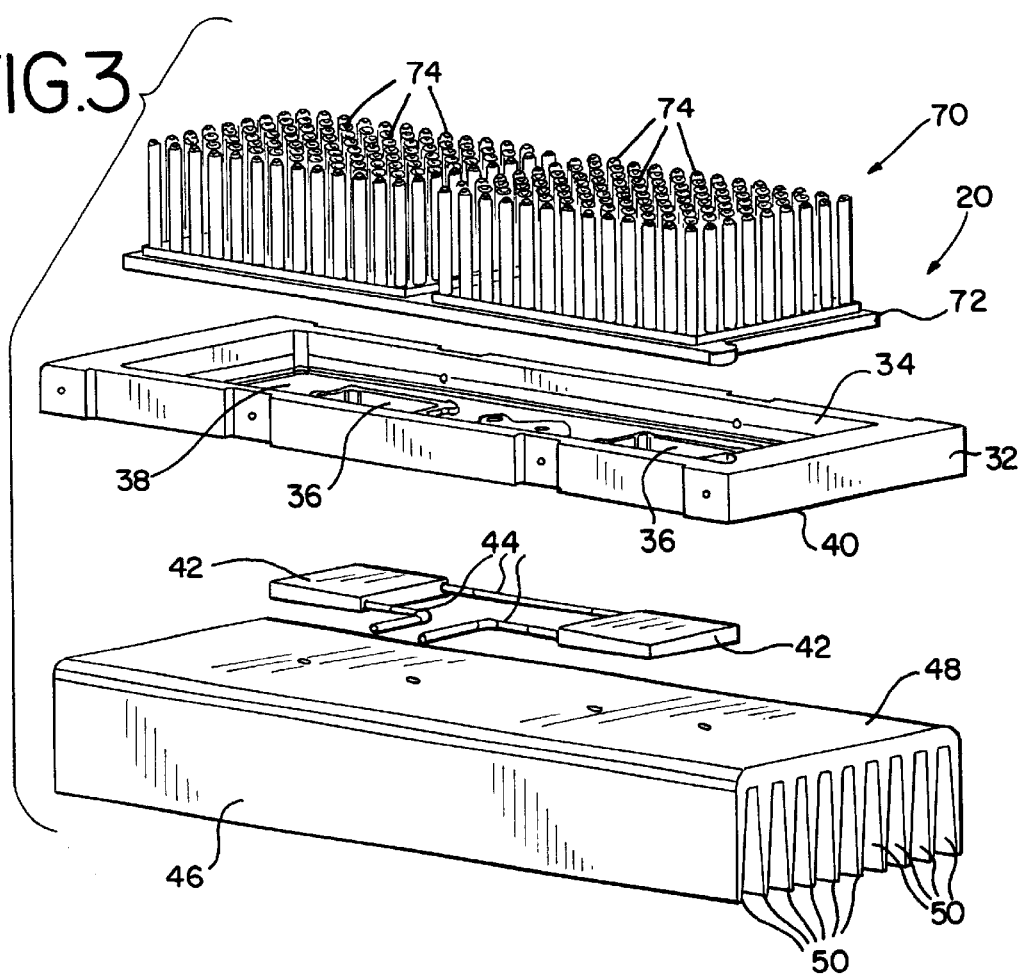
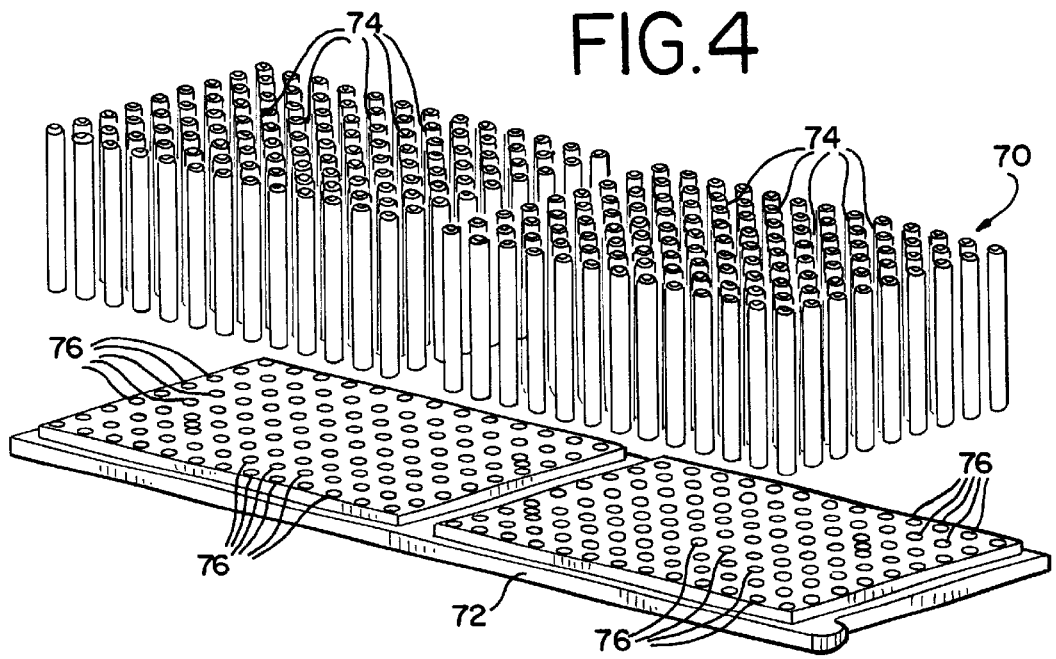

HEAT TRANSFER APPARATUS FOR SAMPLE CONTAINING WELL PLATES

FIELD OF THE INVENTION

The present invention relates to apparatus for cooling or heating samples contained in the wells of well plates.

DESCRIPTION OF THE PRIOR ART

In pharmaceutical, genomic and proteomic research and drug development laboratories, and other biotechnology applications, automated liquid handlers are used for handling laboratory samples in a variety of laboratory procedures. For example, liquid handlers are used for biotechnological and pharmaceutical liquid assay procedures, sample preparation, compound distribution and the like. Sample containing plates having an array of many sample containing receptacles or wells are typically used. For example, one widely used sample containing well plate has an X-Y array of 96 deep wells in an eight by twelve well pattern. Other well plates having different arrays of sample wells are known. Typically the plates have a one piece molded plastic configuration with a peripheral skirt wall, an upper top wall and many individual sample containing wells spaced from adjacent wells and depending down from the top wall.

For some applications, it is desirable to maintain the samples in the sample containing wells at a reduced temperature or at an elevated temperature. Apparatus employing the peltier effect has been used to supply heat to or remove heat from samples in well plates. With the peltier effect heat is produced ort absorbed at the junction of two metals in response to the passage of electrical current. In known apparatus, a well plate is placed upon a heat conducing block or plate that is heated or cooled by one or more peltier effect modules. The well plate can be covered by a thermally insulating cover or can be placed beneath a second heat conducing block or plate that is heated or cooled by one or more peltier effect modules.

These known systems have been unable to effectively and consistently cool or heat samples in well plates. The plastic material of the well plate is not a good conductor of heat. As a result, heated or cooled plates or blocks at the top and/or bottom of the well plate are not in good thermal transfer relationship with samples in the plate wells. Heat is transferred primarily in vertical directions. Deep well plates have wells of about one and one half inches in depth, and this results in a large vertical distances between portions of a contained sample and a heat source or drain above or below the plate. If the well plate is highly insulated from ambient temperatures, known systems can eventually bring samples to or maintain a fairly consistent temperature, but due to the poor hear transfer, this requires substantial time. This is a serious disadvantage because delay prevents high procedure throughputs and can result in deterioration or alteration of the samples prepared for analysis.

SUMMARY OF THE INVENTION

A principal object of the present invention is to provide an improved apparatus for transferring heat to or from samples in wells of a well plate. Other objects are to provide a well plate heat transfer apparatus that can heat or cool sample wells with a high degree of uniformity and in a relatively short time; to provide a heat transfer apparatus that transfers heat to or from sample wells in lateral or horizontal rather than only vertical directions; and to provide a well plate heat transfer apparatus overcoming disadvantages of those used in the past.

In brief, in accordance with the invention there is provided heat transfer apparatus for well plates of the type having a plurality of vertically extending, spaced apart sample containing wells in an array with a predetermined pattern of spaces around the wells. The heat transfer apparatus includes a thermal transfer comb with a base panel and a plurality of vertically extending pins attached in heat transfer relationship to the base panel. The pins are arranged to correspond with the predetermined pattern of spaces around the wells of the well plate. A source for supplying or absorbing heat is in heat transfer proximity with the thermal transfer comb.

BRIEF DESCRIPTION OF THE DRAWING

The present invention together with the above and other objects and advantages may best be understood from the following detailed description of the preferred embodiment of the invention illustrated in the drawings, wherein:

FIG. 3 is an exploded isometric view of the thermal assembly of the heat transfer apparatus;

FIG. 4 is an exploded isometric view of the thermal transfer comb of the thermal assembly;

DETAILED DESCRIPTION OF THE PREFERRED EMBODIMENT

Figure 1:
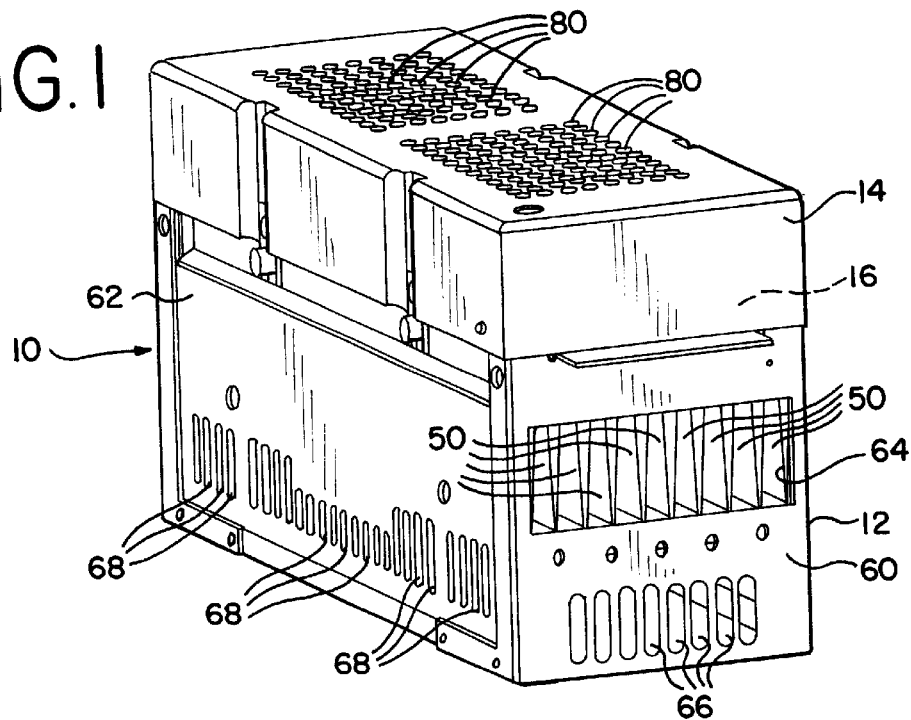
FIG. 1 is an isometric view of a heat transfer apparatus constructed in accordance with the present invention and used for cooling or heating samples in sample containing well plates.
Figure 2:
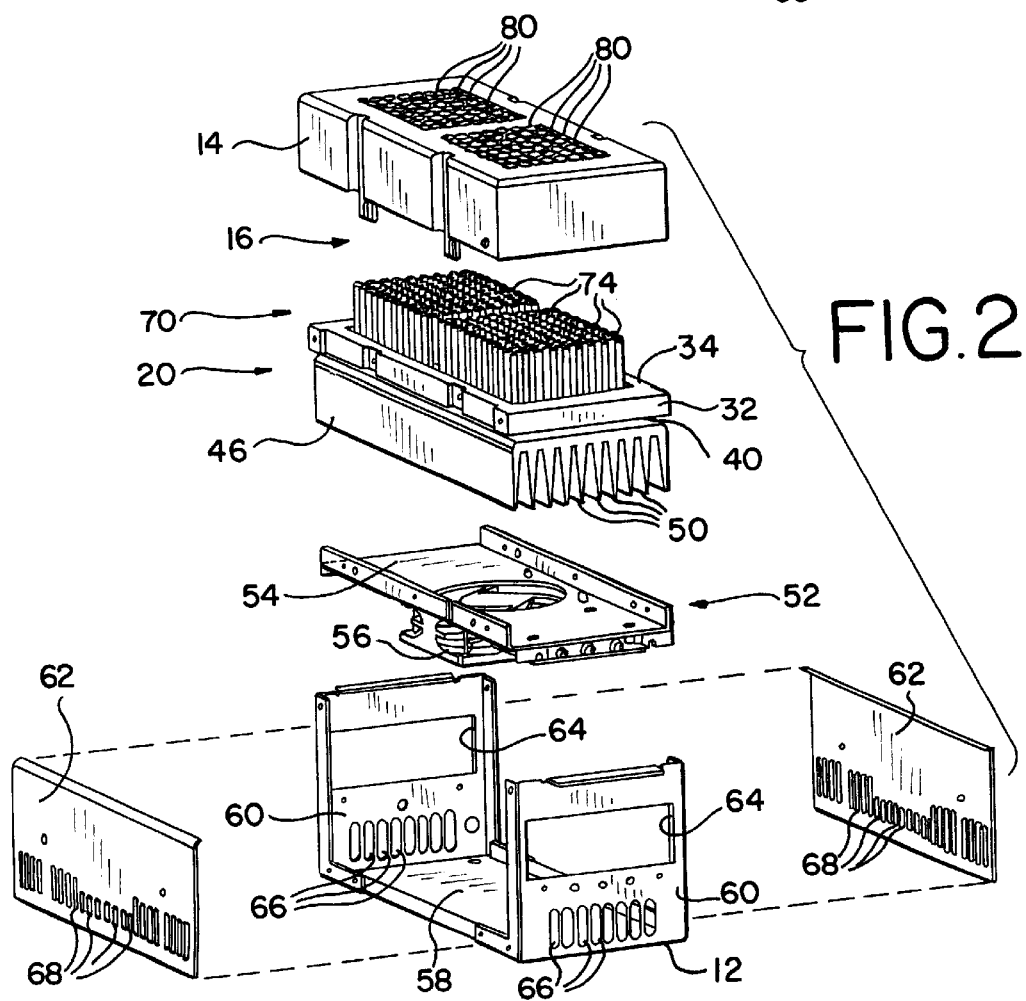
FIG. 2 is an exploded isometric view, on a reduced scale, of components of the heat transfer apparatus of FIG. 1.
Figure 5:
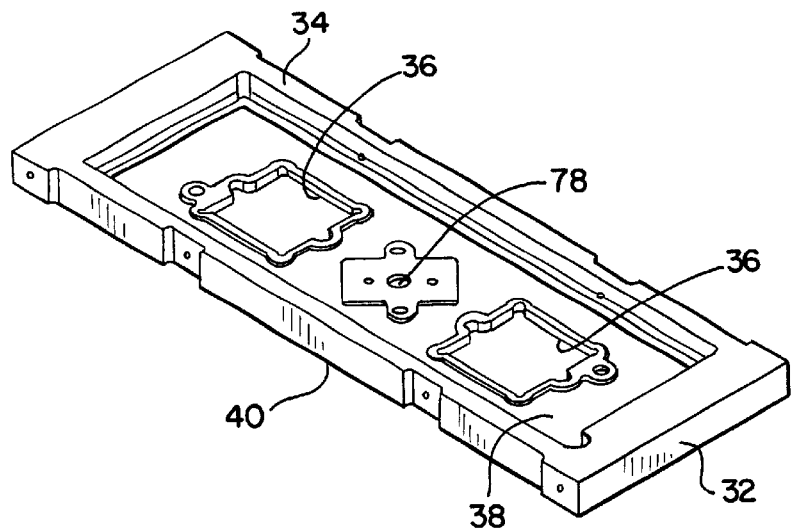
FIG. 5 is an isometric view of the thermal insulation jacket of thermal assembly.

Having reference now to the drawings, and initially to FIGS. 1 and 2, there is shown a heat transfer apparatus generally designated as 10 and constructed in accordance with the principles of the present invention. The apparatus 10 includes a base housing 12 and a mating cover 14 that encloses a well plate chamber 16 adapted to contain a pair of 96 well deep well microtiter plates 18 (FIG. 6) that are cooled or heated by a thermal assembly generally designated as 20 and mounted within the housing 12.

Figure 6:
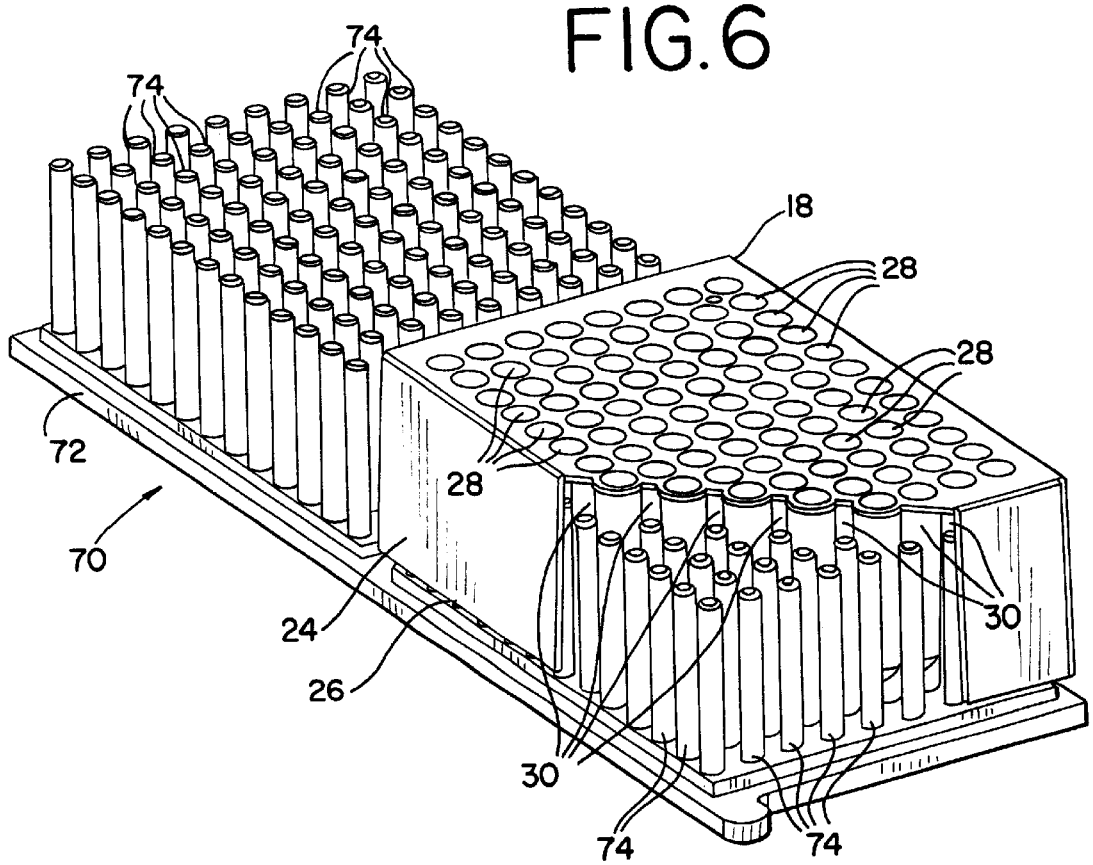
FIG. 6 is a fragmentary isometric view of the thermal transfer comb with a deep well sample plate in place, with part of the well plate removed to reveal the thermal transfer comb.

One well plates 18 is seen in FIG. 6. It is of a molded one piece plastic construction and includes a top wall 22 and a peripheral side or skirt wall 24 with a lower edge 26. Numerous open topped sample containing wells 28 depend from the top wall 22. Each well 28 has a cylindrical side wall and a closed bottom wall. The wells 28 are in a regular array with each well uniformly spaced apart from its neighbors. In the illustrated arrangement the heat transfer apparatus 10 accommodates two plates 18 with wells having a depth of about one and one-half inches, and the wells 28 are in an X-Y array of 96 wells in an eight by twelve well pattern. The principles of the invention can be applied to other configurations of more or fewer plates and the plates can be of various configurations, for example having more or fewer wells 28. Each well 28 is surrounded and flanked by four vertically extending open spaces 30. The well plate 18 and each of the spaces 30 are open bottomed. In the illustrated eight by twelve well pattern, the spaces 30 are in a nine by thirteen pattern.

The thermal assembly 20 (FIG. 3) includes a generally flat, planar, thermally insulating jacket 32 having a peripheral flange 34. A pair of module sockets 36 extend between upper and lower faces 38 and 40 of the jacket 32. A peltier effect module 42 is seated in each module socket 36 and is exposed at the upper and lower jacket faces 38 and 40. Electrical conductors 44 interconnect the modules 42 with a power source that operates the modules 42 selectively to transfer heat in upward or downward directions between the top and the bottom of the module 42.

A heat sink 46 has a flat upper surface 48 that underlies the lower face 38 of the jacket 32 in heat transfer contact with the bottoms of the peltier effect modules 42. Fins 50 extend downward from the upper surface 48 to increase the surface area and heat dissipation performance of the heat sink 46.

A fan assembly 52 includes a shelf or shroud 54 with a central opening aligned with a fan 56. The fins 50 are received in the shelf 54 within the housing 12. Housing 12 includes a bottom wall 58, end walls 60 and side walls 62. When the fan 56 is operated, air moves through flow openings 64 in the end walls 60, through the opening 54 and through vent openings 66 and 68 in the end walls 60 and side walls 62. The flow openings 64 are aligned with the ends of the fins 50 (FIG. 1) and air flows across the surfaces of the fins 50 to remove heat from or provide heat to the heat sink 46.

In accordance with the invention a thermal transfer comb 70 transfers heat to or from the wells 28. The comb 70 includes a generally flat base panel 72 and numerous upstanding pins 74. The base panel 72 is received upon the upper face 38 and within the peripheral flange 34 of the jacket 32 and is in contact with the upper surfaces of the peltier effect modules 42. The pins 74 are in good heat transfer contact with the base panel 72. As seen in FIG. 4, the base panel 72 includes an array of holes 76, and in the preferred arrangement the pins 74 are press fitted with an interference fit into the holes 76.

When the modules 42 are operated to move heat away from the tops of the modules 42, the comb 70 including the pins 74 is chilled to a temperature significantly lower than the ambient temperature. Heat is removed by the heat sink 46 and by air moved by the fan 56. When the modules 42 are operated to move heat toward from the tops of the modules 42, the comb 70 including the pins 74 is heated to a temperature significantly higher than the ambient temperature. Heat is supplied by the heat sink 46 and by air moved by the fan 56.

The pins 74 of the thermal transfer comb 70 are arrayed to transfer heat quickly and effectively to or from each of the sample containing wells 28. The array of pins 74 is the same as the array of spaces 30. When the well plates 18 are placed into the well plate chamber 16, a pin 74 extends upwardly into each of the spaces 30. Each well 28 is flanked and surrounded by four pins 74, and the pins extend vertically throughout essentially the entire vertical depth of the wells 28. Every portion of a sample contained in a well 28 is in close proximity to four surrounding pins 74, and heat is transferred horizontally in short distances between the contents of each sample well 28 and its surrounding pins 74. The short and low interference horizontal thermal transfer paths assure quick and uniform cooling or heating of the contained samples.

The jacket 32 includes a pad portion 78 that can hold a temperature sensor contacting the base panel 72 of the thermal transfer comb 70. A sensor can provide a signal used, for example, to monitor the operation of the heat transfer apparatus 10.

Cover 14 is placed over the well plates 18 in the chamber 16 to reduce the escape or entry of heat from or to the chamber 1 6 and assist the cooling or heating of samples I the wells 28. The cover 14 has apertures 80 aligned with the open tops of the sample wells 28. The apertures 80 provide access to the wells 28, for example to probes of an automated liquid handler or to tips of a manually operated pipette.

While the present invention has been described with reference to the details of the embodiment of the invention shown in the drawing, these details are not intended to limit the scope of the invention as claimed in the appended claims.

What is claimed is:

1. Heat transfer apparatus for well plates of the type having a plurality of vertically extending, spaced apart sample containing wells in an array with a predetermined pattern of spaces around the wells, said heat transfer apparatus comprising:
   a thermal transfer comb including a base panel and a plurality of vertically extending pins attached in heat transfer relationship to said base panel;
   said pins being arranged to correspond with the predetermined pattern of spaces around the wells of the well plate; and
   a source for supplying or absorbing heat, said source being in heat transfer proximity with said thermal transfer comb.

2. Heat transfer apparatus as claimed in claim 1, the well plate having a rectilinear row and column X-Y well array where there are n wells in each X row and m wells in each Y column, said pins being in a rectilinear row and column array with at least n+1 pins in each X row and at least m+1 pins in each Y column.

3. Heat transfer apparatus as claimed in claim 2, said pins being in an array with n+1 pins in each X row and m+1 pins in each Y column.

4. Heat transfer apparatus as claimed in claim 1, said source comprising a peltier effect module in contact with the underside of said base panel.

5. Heat transfer apparatus as claimed in claim 4, further comprising a heat sink in contact with the underside of said peltier effect module.

6. Heat transfer apparatus as claimed in claim 5, further comprising a fan for moving air across said heat sink.

7. Heat transfer apparatus as claimed in claim 1, said base panel having a pattern of holes, said pins being received in said holes.

8. Heat transfer apparatus as claimed in claim 7, said pins being pressed into said holes.

9. Heat transfer apparatus for well plates of the type having a top wall and a plurality of spaced apart sample containing wells arranged in rows and columns depending down from the top wall with a predetermined pattern of spaces around and between the wells, said heat transfer apparatus comprising:
   a flat planar thermally insulating jacket containing a module socket;

a peltier effect module seated in said socket and having upper and lower faces exposed at the top and bottom of said jacket;

a heat sink below said jacket in heat transfer proximity to said lower face of said module; and a thermal transfer comb having a base panel supported at the top of said jacket in thermal transfer relation with said upper face of said module;

said comb having an array of thermally conductive pins extending vertically up from said base panel, said array corresponding to the predetermined pattern of spaces of the well plate.

10. Heat transfer apparatus as claimed in claim 9 further comprising a heat insulating cover carried by said jacket and enclosing said thermal transfer comb.

11. Heat transfer apparatus as claimed in claim 10, said cover having well access openings in rows and columns corresponding to the wells of the well plate.

12. Heat transfer apparatus as claimed in claim 9 further comprising a lower housing surrounding said heat sink, and a fan for moving air through said lower housing and across said heat sink.

* * * * *